(12) United States Patent
Mohanty et al.

(10) Patent No.: US 10,811,086 B1
(45) Date of Patent: Oct. 20, 2020

(54) SRAM WRITE YIELD ENHANCEMENT WITH PULL-UP STRENGTH MODULATION

(71) Applicant: QUALCOMM Incorporated, San Diego, CA (US)

(72) Inventors: Shiba Narayan Mohanty, Bangalore (IN); Sharad Kumar Gupta, Bangalore (IN); Rahul Sahu, Bangalore (IN); Pradeep Raj, Bangalore (IN); Veerabhadra Rao Boda, Bangalore (IN); Adithya Bhaskaran, Bangalore (IN); Akshdeepika, Bangalore (IN)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/523,350

(22) Filed: Jul. 26, 2019

(51) Int. Cl.
*G11C 11/00* (2006.01)
*G11C 11/418* (2006.01)
*G11C 11/412* (2006.01)
*G11C 11/419* (2006.01)

(52) U.S. Cl.
CPC .......... *G11C 11/418* (2013.01); *G11C 11/412* (2013.01); *G11C 11/419* (2013.01)

(58) Field of Classification Search
CPC .................................................. G11C 11/412
USPC .......................................................... 365/154
See application file for complete search history.

(56) References Cited

U.S. PATENT DOCUMENTS

| 10,614,865 B1* | 4/2020 | Mohanty | ................. G11C 8/08 |
| 2015/0131364 A1* | 5/2015 | Hsieh | .................. G11C 11/419 365/154 |

* cited by examiner

*Primary Examiner* — Hoai V Ho
(74) *Attorney, Agent, or Firm* — Haynes and Boone, LLP

(57) ABSTRACT

A memory is provided that includes a negative bit line boost circuit for boosting a discharged bit line to a negative voltage during a negative bit line boost period for a write operation to a selected column in the memory. The memory also includes a core voltage control circuit configured to float a core power supply voltage for the selected column during the negative bit line boost period.

20 Claims, 5 Drawing Sheets

SRAM WRITE YIELD ENHANCEMENT WITH PULL-UP STRENGTH MODULATION

TECHNICAL FIELD

This application relates to memories, and more particularly to a memory adapted to modulate the pull-up strength during a negative bit line boost period.

BACKGROUND

A static random access memory (SRAM) bitcell includes a pair of cross-coupled inverters. Depending upon the binary state of a stored data bit, a p-type metal oxide semiconductor (PMOS) transistor in one of the cross-coupled inverters charges a data node to a memory power supply voltage. During a write operation in which the binary content of the bitcell is changed, an n-type metal-oxide semiconductor (NMOS) access transistor is attempting to discharge the same data node. The resulting NMOS/PMOS struggle slows the write operation speed and consumes power.

Accordingly, there is a need in the art for memories having an enhanced negative bit line boost with reduced power consumption and increased speed.

SUMMARY

A memory is disclosed that includes: a multiplexed group of columns, wherein each column in the multiplexed group of columns includes a column power supply rail for a plurality of bitcells in the column; a negative bit line boost circuit configured to boost a bit line for a selected column in the multiplexed group of columns to a negative voltage while a negative bit line boost signal is asserted; a memory power supply node configured to provide a memory power supply voltage; and a core voltage control circuit including a group of first switches corresponding to the multiplexed group of columns, wherein each first switch is coupled between the memory power supply node and the corresponding column's power supply rail, and wherein each first switch is configured to close while the negative bit line boost signal is not asserted and configured to open while the negative bit line boost signal is asserted.

In addition, a method for a write operation to a bitcell in a first column in a memory is provided that includes the acts of: selecting for the first column from a group of multiplexed columns to couple the bitcell to a discharged bit line; boosting the discharged bit line to a negative voltage during a negative bit line boost period; disconnecting a first power supply rail for the first column from a power supply node during the negative bit line boost period to float a core power supply voltage for the bitcell; and reconnecting the first power supply rail for the bitcell to the power supply node after a termination of the negative bit line boost period to recharge the core power supply voltage for the bitcell.

Finally, a memory is provided that includes: a group of multiplexed columns, wherein each column in the group of multiplexed columns includes an independent power supply rail configured to power a plurality of bitcells within the column; a negative bit line boost circuit configured to provide a negative bit line voltage boost to a bit line in a selected column from the group of multiplexed columns for a negative bit line boost period during a write operation, wherein each column in the group of multiplexed columns besides the selected column are non-selected columns; and a core voltage control circuit configured to disconnect the independent power supply rail for the selected column from a power supply node for a power supply voltage during the negative bit line boost period and to maintain a connection for the independent power supply rail in each non-selected column with the power supply node during the write operation.

These advantage features may be better appreciated by a consideration of the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
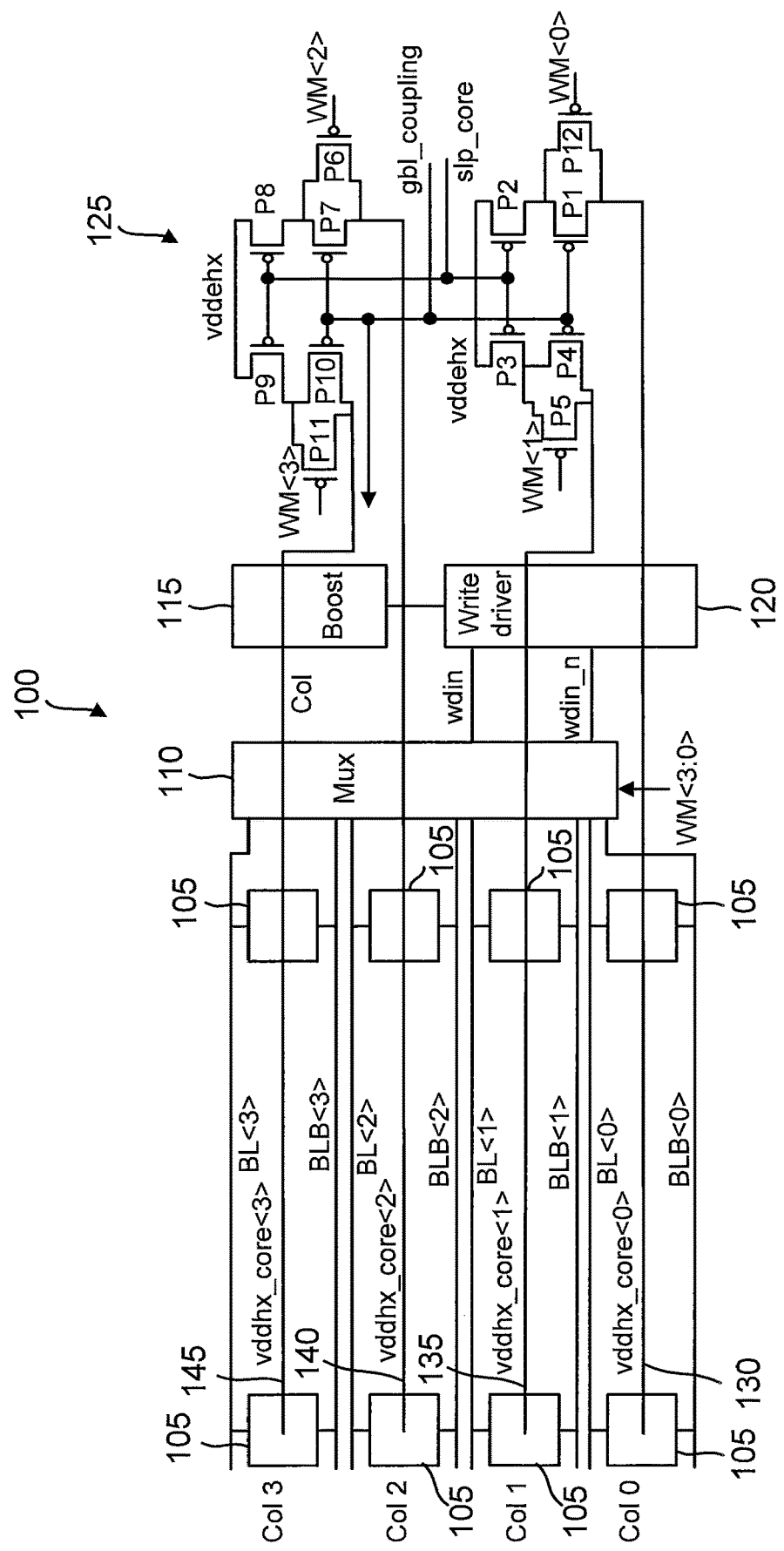
FIG. 1 is a diagram of an example memory including a core power supply circuit that floats a core power supply voltage for a selected column during a negative bit line boost period for a write operation in accordance with an aspect of the disclosure.

To increase write speed and reduce power consumption, an SRAM 100 shown in FIG. 1 is configured to reduce the core power supply during the negative bit line boost period for a selected column during a write operation. For illustration clarity, only a single group of multiplexed columns is shown in FIG. 1 but it will be appreciated that SRAM 100 may include any number of such groups of multiplexed columns. In SRAM 100, the column multiplexing is 4:1 so four columns are shown including a zeroth column (Col 0), a first column (Col 1), a second column (Col 2), and a third column (Col 3). Each column includes a plurality of bitcells 105 arranged into rows according to the word lines (not shown).

During a write operation, a column multiplexer (Mux) 110 selects for one of the four columns. In alternative embodiments, the column multiplexing may be greater or less than the 4:1 multiplexing shown for SRAM 100. Each column includes a pair of bit lines. For example, the zeroth column includes a bit line BL<0> and a complement bit line BLB<0>. The first column includes a bit line BL<1> and a complement bit line BLB<1>. The second column includes a bit line BL<2> and a complement bit line BLB<2>. Finally, the third column includes a bit line BL<3> and a complement bit line BLB<3>. Depending upon which column is being addressed as selected by column multiplexer 110, a write diver 120 drives the bit line pair in the selected column. In particular, write driver 120 generates a bit line signal wdin that drives the bit line in the selected column. Similarly, write driver 120 generates a complement bit line signal wdin_n that drives the complement bit line in the selected column. Depending upon the bit to be written, either the bit line signal wdin or the complement bit line signal wdin_n is a binary one signal (charged to a power supply voltage vdd). The remaining write drive signal would be a binary zero signal (discharged to ground).

Figure 2:
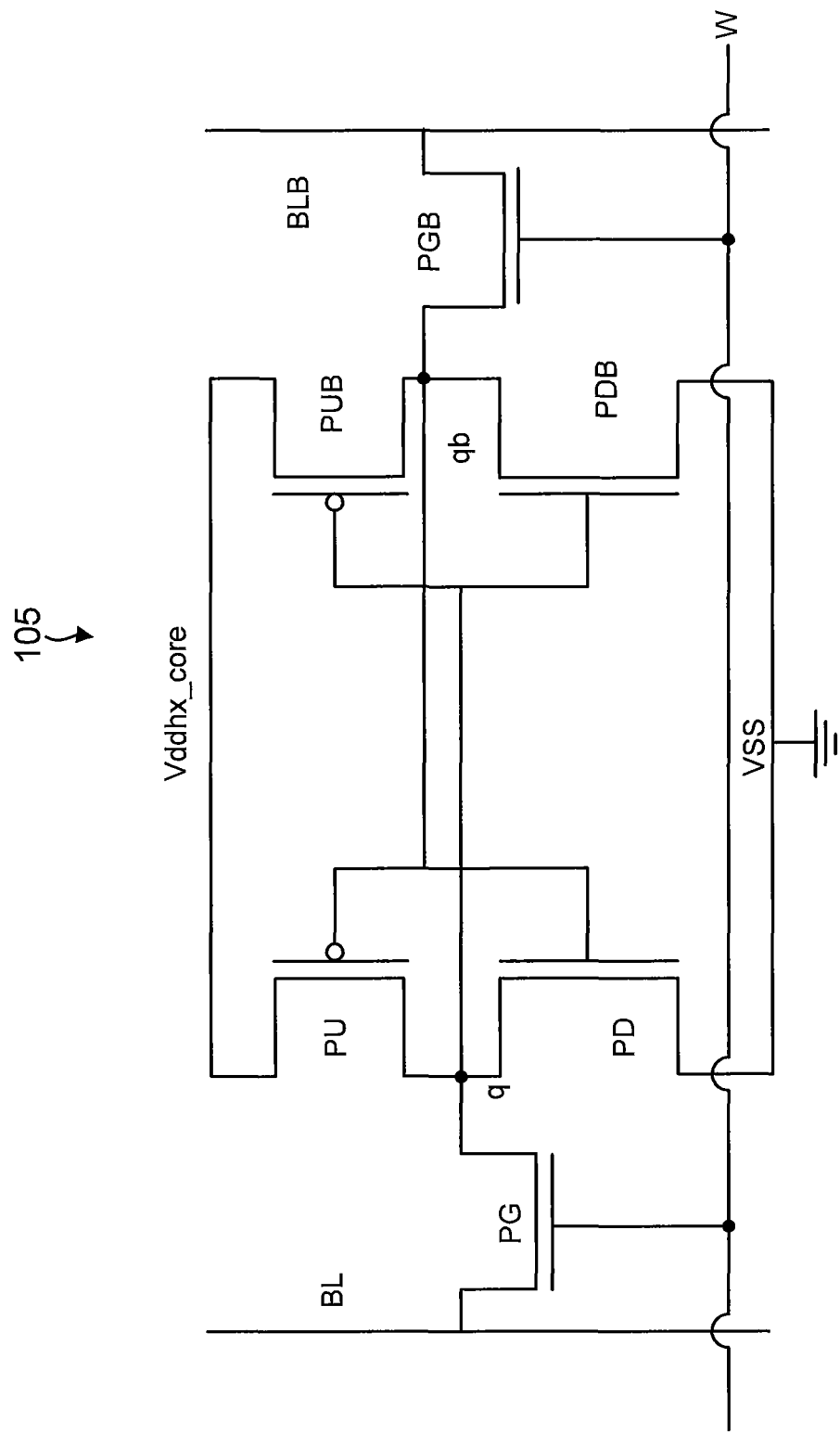
FIG. 2 is a circuit diagram of a bitcell in the example memory of FIG. 1.

An example bit cell 105 is shown in more detail in FIG. 2. A first cross-coupled inverter includes an n-type metal-oxide semiconductor (NMOS) pull-down (PD) transistor in series with a p-type metal-oxide semiconductor (PMOS) pull-up (PU) transistor. The source of the pull-up transistor is connected to a power supply node for a core power supply voltage (vddhx_core). The source of the pull-down transistor is connected to ground. The drains of the pull-up and pull-down transistors forms a true (q) output node for bitcell 105. A second cross-coupled inverter includes an NMOS complement pull-down (PDB) transistor in series with a PMOS complement pull-up (PUB) transistor. The source of the complement pull-up transistor is connected to the power supply node for the core power supply voltage (vddhx_core). The source of the complement pull-down transistor is connected to ground. The drains of the pull-up and pull-down transistors forms a complement (qb) output node for bitcell 105. To complete the cross-coupling between the inverters, the q node is connected to the gates of the complement pull-up and pull-down transistors whereas the qb node is connected to the gates of the pull-up and pull-down transistors.

During a write access to bitcell 105, a word line W is asserted that drives a gate of an NMOS access (PG) transistor and an NMOS complement access (PGB) transistor. When switched on, the PG access transistor couples the q node to the bit line BL. Similarly, when the PBG access transistor is switched on, the PGB transistor couples the complement node qb to the complement bit line BLB. Suppose that bitcell 105 is storing a binary one value such that the pull-up transistor is on to charge the q node to the core power supply voltage but that a write operation is attempting to flip bitcell 105 so that it stores a binary zero. The access transistor PG switches on to couple the grounded bit line BL to the charged q node. A PMOS-NMOS struggle ensues in which the PMOS pull-up transistor remains transiently on and attempting to maintain the charged state of the q node while the NMOS access transistor discharges the q node. To speed the write operation, it is conventional to increase the size of the access transistors but then density is lowered.

Figure 3:
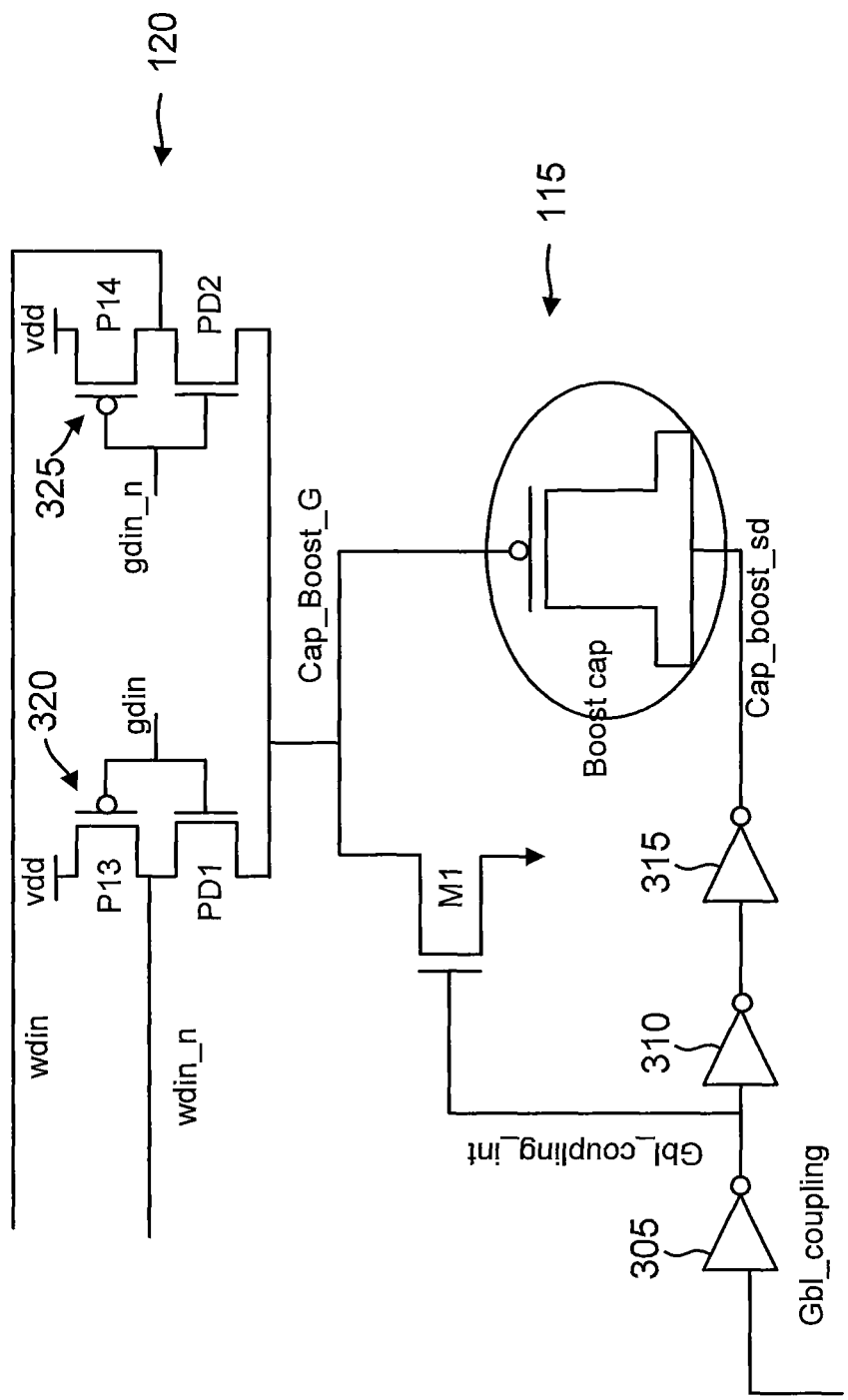
FIG. 3 is a circuit diagram of the write driver and negative bit line boost circuit in the example memory of FIG. 1.

Referring again to FIG. 1, SRAM 100 includes negative bit line boost circuit 115 that strengthens the NMOS access transistor in the NMOS-PMOS struggle to increase the write operation speed. An example negative bit line boost circuit 115 and write driver 120 are shown in more detail in FIG. 3. An active-high negative bit line boost signal (GBL_coupling) is asserted during a negative bit line boost period. An inverter 305 inverts the negative bit line boost signal to form its complement boost signal (GBL_coupling_int) that drives a gate of an NMOS transistor M1 having its source connected to ground. Outside of the negative bit line boost period, the complement boost signal will be charged high so that a drain of transistor M1 is grounded. The drain of transistor M1 forms a ground node for write driver 120. Write driver 120 includes a first inverter 320 that includes an NMOS pull-down transistor PD1 having its source connected to the write driver ground node and includes a PMOS pull-up transistor P13 having its source tied to the power supply voltage node. The drains of transistors P13 and PD1 are tied to the complement input node wdin_n to write multiplexer 110 (FIG. 1). A data input signal gdin drives the gates of transistors P13 and PD1 to control the voltage of the complement input node wdin_n.

A remaining inverter 325 in write driver 120 is constructed analogously. Inverter 325 includes an NMOS pull-down (PD2) transistor having a source tied to the write driver ground node and includes a PMOS pull-up transistor P14 having a source tied to the power supply node. The drains of transistors P14 and PD2 are tied to the input node wdin for write multiplexer 120 (FIG. 1). A complement data input signal gdin_n drives the gates of transistors P13 and PD1 to control the voltage of the input node wdin_n.

Outside of the negative bit line boost period, either the input node wdin or the complement input node wdin_n will be grounded through transistor M1 depending upon the binary value for the data input signal. But when the negative bit line boost signal is asserted, transistor M1 is switched off. A pair of inverters 310 and 315 buffer the complement boost signal to form a buffered version (Cap_boost_sd) of the complement boost signal. The Cap_boost_sd signal drives the drain and source of a PMOS transistor (boost cap). The gate of the boost cap transistor is tied to the ground node for write driver 120. The gate capacitance of the boost cap transistor functions as a negative boost capacitor. Outside of the negative boost period, the drain and source of the boost cap transistor is charged to the power supply voltage whereas its gate is discharged. During the negative boost period, the Cap_boost_sd signal is discharged. The charged gate capacitance for the boost cap transistor then forces the ground node for write driver 120 to have a negative voltage. The grounded bit line in the selected column (either the bit line BL or the complement bit line BLB) will thus be negatively charged during the negative boost period.

Referring again to FIG. 2, suppose again that the q node is charged but that access transistor PG is attempting to discharge the q node. The negative boost to bit line BL strengthens access transistor PG so that it may more quickly overcome the pull-up from the pull-up transistor. But note that the bit line resistance weakens the negative boost. In addition, it is conventional to weaken the word line drive voltage to save power. The combination of the bit line resistance and the lowered voltage for the word line assertion lower the effectiveness of the negative bit line boost.

To increase the negative bit line boost write operation speed and reliability, the core power supply voltage to bitcells 105 in SRAM 100 is segregated by column. A core voltage control circuit 125 floats the core power supply for the selected column during the negative bit line boost period. Referring again to FIG. 2, the pull-up transistor is then weakened by the floating of its core power supply so that the negative bit line boosting to strengthen the pull-down transistor is more effective. Once the negative bit line boost period is over, core voltage control signal circuit 125 ceases the floating of the core power supply voltage. The core power supply for the remaining columns (the unselected columns) is not affected during the negative bit line boost period.

The number of independent power supply rails for SRAM 100 depends upon the column multiplexing. For example, bitcells 105 in the zeroth column are powered by a core power supply vddhx_core<0> carried on a zeroth column power supply rail 130. Similarly, bitcells 105 in the first column are powered by a core power supply vddhx_core<1> carried on a first column power supply rail 135. Bitcells 105 in the second column are powered by a core power supply vddhx_core<2> carried on a second column power supply rail 140. Finally, bitcells 105 in the third column are powered by a core power supply vddhx_core<3> carried on a third column power supply rail 145. In general, an embodiment with N:1 column multiplexing would have N independent core power supply rails, N being a positive integer. Each core power supply rail may have its own decoupling capacitor (not illustrated).

To float the core power supply for the selected column during the negative bit line boost period, core voltage control circuit 125 includes a pair of transistors for each column that couples between the column's power supply rail and a power supply node for a memory power supply voltage (vddehx). The pair of transistors are arranged in parallel. One transistor in the pair is configured to switch off in response to the assertion of a write multiplexing (WM) signal that is asserted when write multiplexer 110 selects for the column. The other transistor is configured to switch off in response to the assertion of the negative bit line boost signal. Both transistors in the pair will thus be off for a selected column during the negative bit line boost signal so that the selected column's core power supply voltage will float during the negative bit line boost period.

In SRAM 100, each pair of transistors in core voltage control circuit 125 are PMOS transistors but it will be appreciated that NMOS transistors may be used in alternative embodiments. For the zeroth column in core voltage control circuit 125, the pair of PMOS transistors is formed by a transistor P1 and a transistor P12. The drains of transistors P1 and P12 are connected to power supply rail 130. To integrate action of core voltage control circuit 125 with a sleep mode, the sources of transistors P1 and P12 couple through a PMOS sleep-mode transistor P2 to the power supply node for the memory power supply voltage vddehx. An active-high sleep mode signal (slp_core) drives the gate of sleep-mode transistor P2 so that sleep-mode transistor P2 is on outside of the sleep mode. An active-high write multiplexing signal WM<0> that is asserted to select for the zeroth column drives the gate of transistor P12 so that transistor P12 is off when the write operation is directed to the zeroth column. The negative bit line boost signal drives the gate of transistor P1 so that transistor P1 is switched off during the negative bit line boost period to float the zeroth column's core power supply voltage vddhx_core<0> during the negative bit line boost period. If the zeroth column is not selected for during a write operation, transistor P12 will be on to maintain the core power supply voltage vddhx_core<0>.

A transistor P5 and a transistor P4 form the pair of transistors in core voltage control circuit 125 that control the first column's core power supply voltage vddhx_core<1>. The write multiplexing signal WM<1> that is asserted to select for the first column drives the gate of transistor P5. The negative bit line boost signal drives the gate of transistor P4. The source of transistors P4 and P5 connect to the power supply node for the memory power supply voltage vddehx through a PMOS sleep-mode transistor P3 controlled by the sleep-mode signal slp_core. The drains of transistors P4 and P5 are connected to power supply rail 135 so that the core power supply voltage vddhx_core<1> floats during the negative bit line boost period for a write operation directed to the first column.

Similarly, a transistor P7 and a transistor P6 form the pair of transistors in core voltage control circuit 125 that control the second column's core power supply voltage vddhx_core<2>. The write multiplexing signal WM<2> that is asserted to select for the second column drives the gate of transistor P6. The negative bit line boost signal drives the gate of transistor P7. The sources of transistors P6 and P7 connect to the power supply node for the memory power supply voltage vddehx through a PMOS sleep-mode transistor P8 controlled by the sleep-mode signal slp_core. The drains of transistors P6 and P7 are connected to power supply rail 140 so that the core power supply voltage vddhx_core<2> floats during the negative bit line boost period for a write operation directed to the second column.

Finally, a transistor P10 and a transistor P11 form the pair of transistors in core voltage control circuit 125 that control the third column's core power supply voltage vddhx_core<3>. The write multiplexing signal WM<3> that is asserted to select for the third column drives the gate of transistor P11. The negative bit line boost signal drives the gate of transistor P10. The source of transistors P10 and P11 connect to the power supply node for the memory power supply voltage vddehx through a PMOS sleep-mode transistor P9 controlled by the sleep-mode signal slp_core. The drains of transistors P10 and P11 are connected to power supply rail 145 so that the core power supply voltage vddhx_core<3> floats during the negative bit line boost period for a write operation directed to the first column.

Figure 4:
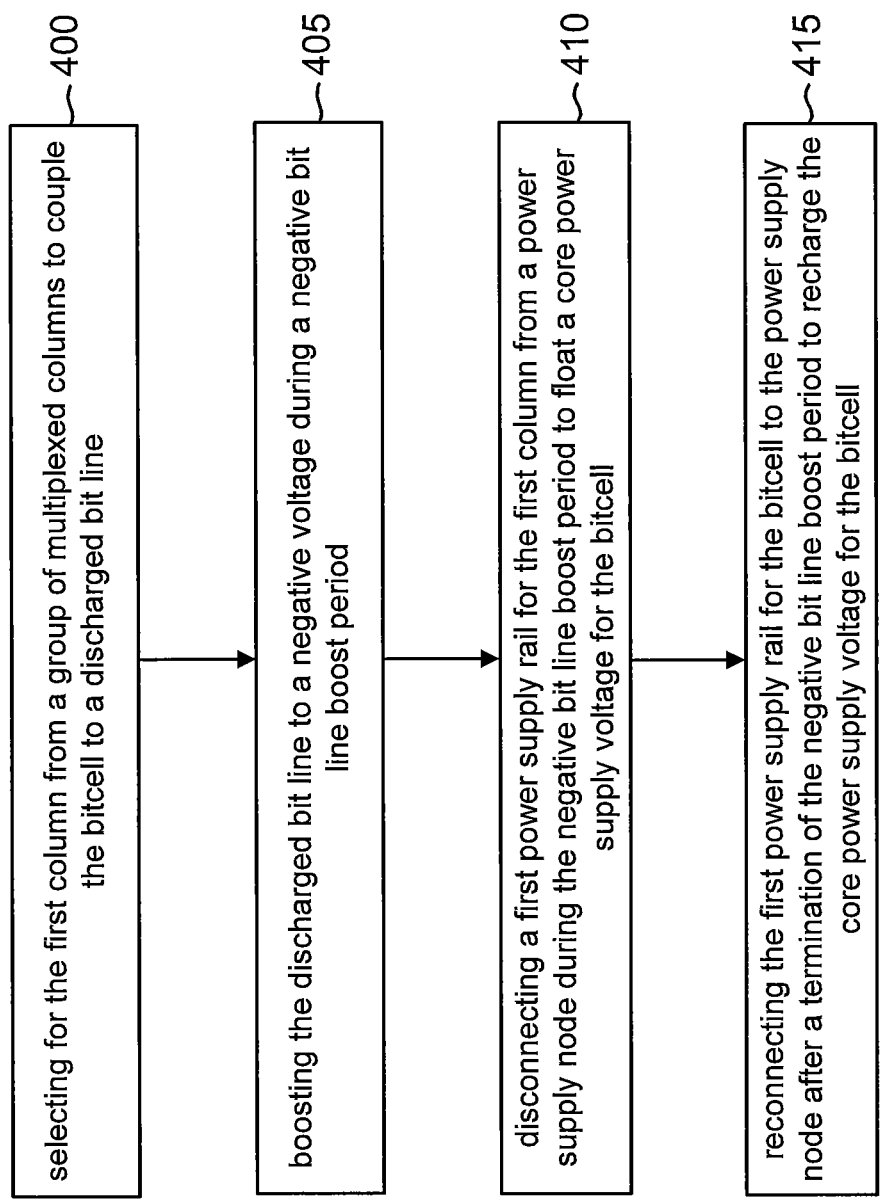
FIG. 4 is a flowchart for a method of floating the core power supply voltage for a selected column during a negative bit line boost period for a write operation in accordance with an aspect of the disclosure.

A flowchart for a method of writing to a bitcell in a selected first column in a memory is shown in FIG. 4. The method includes an act 400 of selecting for the first column from a group of multiplexed columns to couple the bitcell to a discharged bit line. An example of the first column would be any of the columns in SRAM 100. The remaining columns would then be unselected columns. The method also includes an act 405 of boosting the discharged bit line to a negative voltage during a negative bit line boost period. The boosting of discharged bit line BL as discussed for FIG. 2 is an example of act 405. In addition, the method includes an act 410 of disconnecting a first power supply rail for the first column from a power supply node during the negative bit line boost period to float a core power supply voltage for the bitcell. The shutting off of any of transistors P1, P4, P7, or P10 during the negative bit line boost period while the transistor's column is selected is an example of act 410. Finally, the method includes an act 415 of reconnecting the first power supply rail for the bitcell to the power supply node after a termination of the negative bit line boost period to recharge the core power supply voltage for the bitcell. The switching back on of any of transistors P1, P4, P7, or P10 after a termination of the negative bit line boost period while the transistor's column is selected is an example of act 415.

Figure 5:
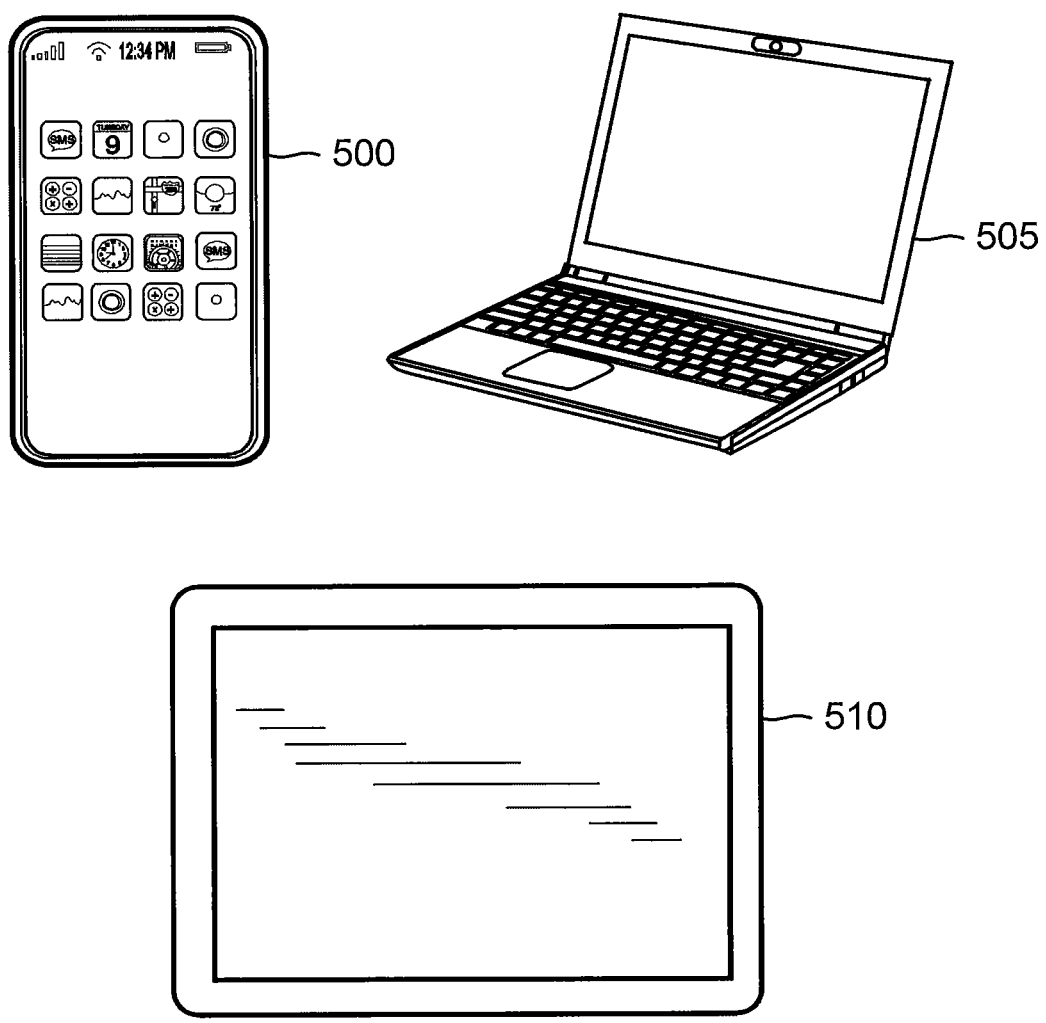
FIG. 5 illustrates some example electronic systems incorporating a memory in accordance with an aspect of the disclosure.

A memory with the floating of the core power supply voltage for a selected column during the negative bit line boost period as disclosed herein may be incorporated into a wide variety of electronic systems. For example, as shown in FIG. 5, a cell phone 500, a laptop 505, and a tablet PC 510 may all include a memory having a core power supply voltage controlled in accordance with the disclosure. Other exemplary electronic systems such as a music player, a video player, a communication device, and a personal computer may also be configured with memories constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A memory comprising:

a multiplexed group of columns, wherein each column in the multiplexed group of columns includes a column power supply rail for a plurality of bitcells in the column;

a negative bit line boost circuit configured to boost a bit line for a selected column in the multiplexed group of columns to a negative voltage while a negative bit line boost signal is asserted;

a memory power supply node configured to provide a memory power supply voltage; and a core voltage control circuit including a group of first switches corresponding to the multiplexed group of columns, wherein each first switch is coupled between the memory power supply node and the corresponding column's power supply rail, and wherein each first switch is configured to close while the negative bit line boost signal is not asserted and configured to open while the negative bit line boost signal is asserted.

2. The memory of claim 1, further comprising:

a column multiplexer, wherein the core voltage control circuit further includes a group of second switches corresponding to the multiplexed group of columns, each second switch being coupled between the memory power supply node and the corresponding column's power supply rail, and wherein each second switch is configured to close while the corresponding column is not selected by the column multiplexer and configured to open while the corresponding column is selected by the column multiplexer.

3. The memory of claim 2, wherein each first switch comprises a first PMOS transistor having a gate configured to receive a negative bit line boost signal, and wherein each second switch comprises a second PMOS transistor having a gate configured to receive a write multiplexing signal for the corresponding column.

4. The memory of claim 2, wherein the core voltage control circuit further includes a group of third switches corresponding to the multiplexed group of columns, each third switch being coupled between the memory power supply node and the corresponding column's first switch and second switch and wherein each third switch is configured to close while a sleep mode for the memory is not active and configured to open while the sleep mode for the memory is active.

5. The memory of claim 4, wherein each third switch comprises a PMOS transistor having a gate configured to receive a sleep-mode signal.

6. The memory of claim 1, wherein the memory is a static random access memory, and wherein each bitcell comprises a pair of cross-coupled inverters.

7. The memory of claim 1, wherein the memory is incorporated into a cellular telephone.

8. The memory of claim 1, wherein the memory is incorporated into a laptop computer.

9. The memory of claim 1, wherein each column's first switch and second switch are arranged in parallel.

10. A method for a write operation to a bitcell in a first column in a memory, comprising:

selecting for the first column from a group of multiplexed columns to couple the bitcell to a discharged bit line;

boosting the discharged bit line to a negative voltage during a negative bit line boost period;

disconnecting a first power supply rail for the first column from a power supply node during the negative bit line boost period to float a core power supply voltage for the bitcell; and reconnecting the first power supply rail for the bitcell to the power supply node after a termination of the negative bit line boost period to recharge the core power supply voltage for the bitcell.

11. The method of claim 10, wherein disconnecting the first power supply rail for the bitcell from the power supply node comprises opening a first switch coupled between the first power supply rail and the power supply node.

12. The method of claim 11, wherein opening the first switch comprises switching off a PMOS transistor.

13. The method of claim 11 wherein the group of multiplexed columns comprises the first column and a group of remaining columns, and wherein each column in the group of remaining columns includes an independent power supply rail, the method further comprising:

maintaining a connection between each independent power supply rail and the power supply node during the write operation to the bitcell.

14. The method of claim 11, further comprising:

during the write operation to the bitcell, opening a second switch coupled in parallel with the first switch between the first power supply rail and the power supply;

after a completion of the write operation to the bitcell, selecting for a second column in the group of multiplexed columns; and closing the second switch responsive the selection of the second column.

15. The method of claim 11, further comprising:

asserting a negative bit line boost signal during the negative bit line boost period, wherein the disconnecting of the first power supply rail for the first column from the power supply node is responsive to the assertion of the negative bit line boost signal.

16. The method of claim 15, wherein the asserting of the negative bit line boost signal is an active-low assertion.

17. A memory, comprising:

a group of multiplexed columns, wherein each column in the group of multiplexed columns includes an independent power supply rail configured to power a plurality of bitcells within the column;

a negative bit line boost circuit configured to provide a negative bit line voltage boost to a bit line in a selected column from the group of multiplexed columns for a negative bit line boost period during a write operation, wherein each column in the group of multiplexed columns besides the selected column are non-selected columns; and a core voltage control circuit configured to disconnect the independent power supply rail for the selected column from a power supply node for a power supply voltage during the negative bit line boost period and to maintain a connection for the independent power supply rail in each non-selected column with the power supply node during the write operation.

18. The memory of claim 17, wherein the write operation is directed to a bitcell in the selected column, and wherein the bitcell comprises a pair of cross-coupled inverters.

19. The memory of claim 17, wherein the core voltage control circuit is further configured to connect the independent power supply rail for the selected column to the power supply node after a termination of the negative bit line boost period.

20. The memory of claim 17, further comprising:

a column multiplexer configured to select the selected column from the group of multiplexed columns during the write operation.

* * * * *